United States Patent
Kumar et al.

(10) Patent No.: US 6,912,113 B2
(45) Date of Patent: Jun. 28, 2005

(54) THIN FILM CAPACITOR USING CONDUCTIVE POLYMERS

(75) Inventors: Prabhat Kumar, Framingham, MA (US); Henning Uhlenhut, Cambridge, MA (US)

(73) Assignee: H. C. Starck, Inc., Newton, MA (US)

( * ) Notice: Subject to any disclaimer, the term of this patent is extended or adjusted under 35 U.S.C. 154(b) by 0 days.

(21) Appl. No.: 10/801,324

(22) Filed: Mar. 16, 2004

(65) Prior Publication Data

US 2004/0173873 A1 Sep. 9, 2004

Related U.S. Application Data

(62) Division of application No. 10/285,748, filed on Nov. 1, 2002, now Pat. No. 6,731,495.
(60) Provisional application No. 60/337,719, filed on Nov. 3, 2001.

(51) Int. Cl.$^7$ ................................. H01G 4/30
(52) U.S. Cl. ................ 361/301.4; 361/301.1; 361/303; 361/306.1; 361/306.3; 361/311; 361/313
(58) Field of Search ............ 361/301.1, 301.4, 361/303, 305, 306.1, 306.3, 311, 312, 313, 321, 321.4, 321.5, 329, 330

(56) References Cited

U.S. PATENT DOCUMENTS

| | | | | |
|---|---|---|---|---|
| 5,978,207 A | * | 11/1999 | Anderson et al. | 361/311 |
| 6,212,057 B1 | * | 4/2001 | Kohara et al. | 361/301.4 |
| 6,552,384 B2 | * | 4/2003 | Murata et al. | 257/307 |
| 6,556,421 B2 | * | 4/2003 | Aoki et al. | 361/311 |

FOREIGN PATENT DOCUMENTS

| | | |
|---|---|---|
| EP | 1005260 A | 5/2000 |
| JP | 05047588 | 2/1993 |
| JP | 05114532 | 5/1993 |

* cited by examiner

*Primary Examiner*—Dean A. Reichard
*Assistant Examiner*—Nguyen T. Ha
(74) *Attorney, Agent, or Firm*—Joseph C. Gil; Diderico van Eyl

(57) ABSTRACT

The invention relates to a thin film capacitor containing (a) a substrate, (b) a first polymeric film comprising an electrically conductive polymer located on the substrate, (c) a pentoxide layer selected from the group consisting of tantalum pentoxide, or niobium pentoxide, and mixtures thereof, (d) a second polymeric film comprising an electrically conductive polymer located on the pentoxide layer.

11 Claims, 2 Drawing Sheets

THIN FILM CAPACITOR USING CONDUCTIVE POLYMERS

This application is a Divisional of Ser. No. 10/285,748, filed Nov. 1, 2002 now U.S. Pat. No. 6,731,495.

BACKGROUND OF THE INVENTION

The present invention relates to stacks of thin films used as capacitors.

It is well known in electronic circuits to use capacitors. Printed circuit boards (PCBs) have a limitation of using roll form or powder/electrolytic capacitors suspended over or under the board. It would be desirable to have a flat capacitor that can be attached directly to the board, or be integrated in the board with adequate electrical parameters and stability. As such, it is an object of the invention to provide such a capacitor.

It has been discovered that this object can be met by a capacitor that includes alternating layers of tantalum pentoxide or niobium pentoxide and an electrically conductive polymer film such as H.C. Starck, Inc.'s Baytron® line of polythiophene-based polymers. Advantageously, many types of thin conductive polymer films can be used.

SUMMARY OF THE INVENTION

The invention relates to a thin film capacitor that includes (a) a substrate, (b) a first polymeric film comprising an electrically conductive polymer located on the substrate, (c) a pentoxide layer selected from the group consisting of tantalum pentoxide, or niobium pentoxide, and mixtures thereof, located on a surface of the first polymeric film, (d) a second polymeric film comprising a conductive polymer located on a surface of the pentoxide layer.

DESCRIPTION OF THE FIGURES

These and other features, aspects, and advantages of the present invention will become better understood with reference to the following description and appended claims, where:

DESCRIPTION OF THE INVENTION

Figure 1:
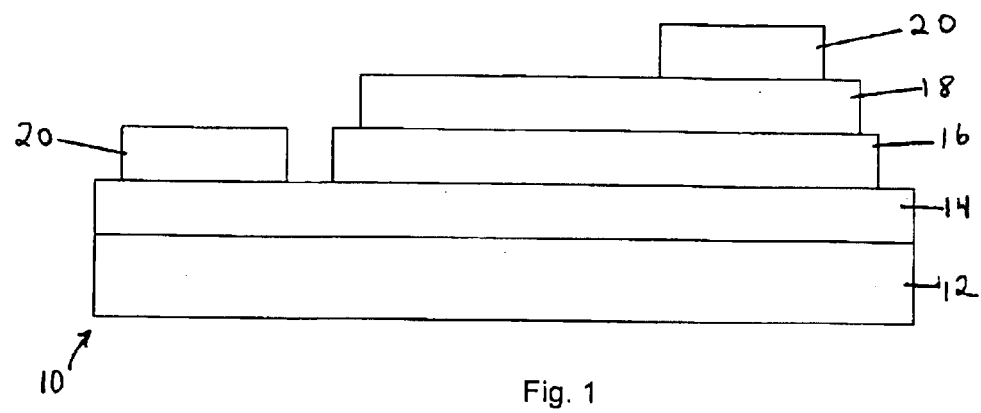
FIG. 1 shows schematically an embodiment of a capacitor made in accordance with the invention.

The invention relates to a thin film capacitor comprising (a) a substrate, (b) a first polymeric film comprising a conductive polymer located on the substrate, (c) a pentoxide layer selected from the group consisting of tantalum pentoxide, or niobium pentoxide, and mixtures thereof, and (d) a second polymeric film comprising a conductive polymer located on the pentoxide layer.

The substrate can be any substrate, which when used in accordance with the invention, enables the resulting thin film capacitor to be used in its intended application. Generally, the substrate is a non-conductive substrate and can be selected from materials such as vinyl polymers, olefin polymers or polyester polymers. The thickness of the substrate is generally at least about about 0.01 mm. The thickness of the substrate can vary widely, depending on the application. In one embodiment, the thickness ranges from about 0.01 to about 1 mm.

A polymeric film can include any electrically conductive polymer, which when used in accordance with the invention, enables the resulting thin film capacitor to be used in its intended use. Examples of suitable conductive polymers include polyaniline-based polymers, polypyrrole-based polymers, polyethyleneoxide-based polymers, polythiophene-based polymers, and mixtures or copolymers thereof. These polymers are well known in the art.

Particularly advantageous conductive polymers are included in the BAYTRON® line of conductive polymers, available from H.C. Starck, Inc, preferably conductive poly (3,4ethylene dioxythiophene), as described in U.S. Pat. No. 5,035,926, incorporated herein in its entirety. Such polymers are preferably synthesized by mixing the corresponding monomer in solution with iron(III)p-toluenesulfonate held in organic solvents such as isopropanol or ethanol. When polymerized, an iron salt precipitate appears which is removed by washing with water. The conductive polymer can also be provided as an aqueous solution in the presence of poly(styrenesulfonic acid) which serves as a colloid stabilizer. Generally, these conductive polymers exhibit high conductivity, high transparency in thin films, high stability, and easy processing. The fields of application of these polymers include but are not limited to antistatic coating of plastics, antistatic coating of glass, electrostatic coating of plastics, capacitor electrodes (tantalum and aluminum), through-hole plating of printed circuit boards (PCBs), and polymer light emitting diode displays.

One such polythiophene preferred polymer, "Baytron P" is an aqueous polymer dispersion that exhibits good adhesion. If necessary, adhesion can be improved by addition of binders. Such an aqueous dispersion is easily applied to plastic and glass surfaces, e.g., by printing or spraying, and is water-based and thus environmentally friendly.

The conductive polymer is generally combined with suitable binders for coating. Examples of suitable binders include but are not limited to polyvinyl acetate, polycarbonate, polyvinyl butyrate, polyacrylates, polymethacrylates, polystyrene, polyacrylonitrile, polyvinyl chloride, polybutadiene, polyisoprene, polyethers, polyesters, silicones, pyrrole/acecrylate, vinyl acetate/acrylate, ethylene/vinyl acetate copolymers, poly vinyl alcohols.

The thickness of a conductive polymeric film is generally at least about 50 nanometers and preferably ranges from about 100 nanometers to about 10 micrometers, depending on the application.

In one embodiment, the invention relates to a thin film capacitor including (a) a substrate, (b) a first polymeric conductive layer located on a surface of the substrate and (c) a plurality of alternating pentoxide layer/polymeric conductive layers extending from the first polymeric layer, wherein the total number of pentoxide layers is n and the total number of polymeric conductive layers is n+1, in which n preferably ranges from 1 to 30. In another embodiment, there can be 2 to 20 layers of each of the components (generally more conductive film layer than oxide layers). Serial or parallel connections can be made to each of the virtual capacitors in such a stack. Preferably, the whole stack of films is on a non-conductive substrate such as a vinyl, olefin or polyester film.

In one embodiment, each of the conductive films is about one micron thick and applied by printing, spraying or other wet methods from liquid or solution precursors. In another embodiment, each of the Ta, Nb-oxide films is about one micron thick and applied by reaction physical vapor deposition (PVD) or chemical methods from liquid or vapor precursors. Alternatively Ta or Nb can be applied and oxidized in situ.

The capacitors so made have an advantage over known $Ta_2O_5/Cu/Ta_2O_5/Cu$ ... stacks in that the present stacks will be less susceptible to deterioration under influence of environmental humidity. Also a short stack (2–4 layers each of oxide and polymer) can be transparent.

Referring to the figures, FIG. 1 shows schematically an embodiment of a capacitor 10 made per the invention. A polymer substrate 12 (e.g. Mylar™ film) is coated with a one micron layer of polythiophene conductor 14, in turn overlaid with a 100 nanometer tantalum pentoxide film 16 then another one micron layer 18 of the conductor. Silver connection pads 20 are applied to the layers 14 and 18. Such a capacitor was fabricated. It was tested at five volts and showed a capacitance of about 350 nanofards per sq. cm. of oxide area.

Figure 2:
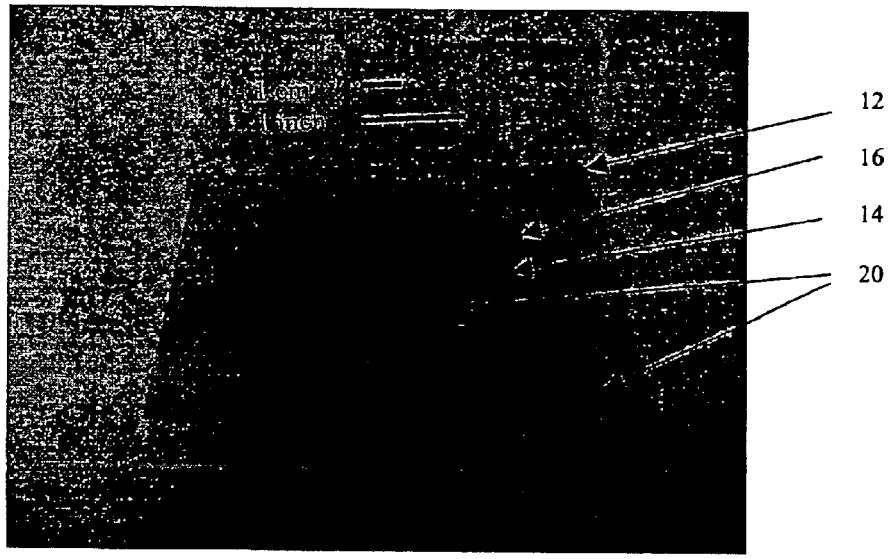
FIG. 2 is a photograph of such a capacitor.

FIG. 2 is a photograph of such a capacitor with reference numbers indicating the FIG. 1 layers. Fiduciary 1 cm., 1 in. (2.54 cm) markers are shown. The circle of conductive layers 14 is about 2.75 in. (6.98 cm) in diameter.

In one embodiment, the capacitor can be made in 1–30 oxide layers alternating with the conductive layers. If desired the substrate film 12 can have a silicone coating and be removed after building the capacitor. Similarly transfer overcoatings can be applied to attach the capacitor to a new substrate. In other embodiments, the capacitor can be made having more than 30 oxide layers.

Figure 3:
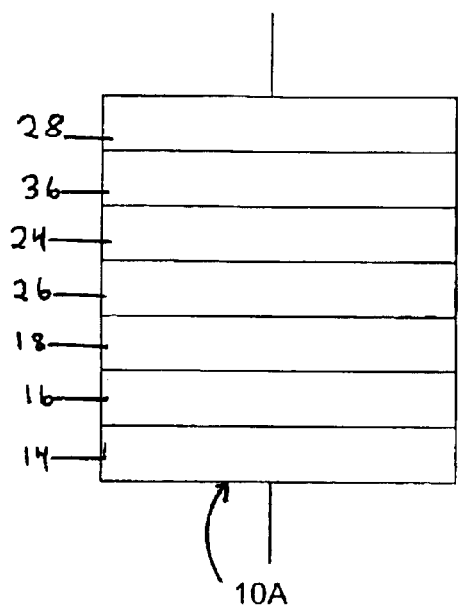
FIGS. 3a, and 3b show schematically serial and parallel connections of a conductive poly(3,4-ethylenedioxythiophene) film (Baytron) oxide array with 3 layers.
Figure 3:
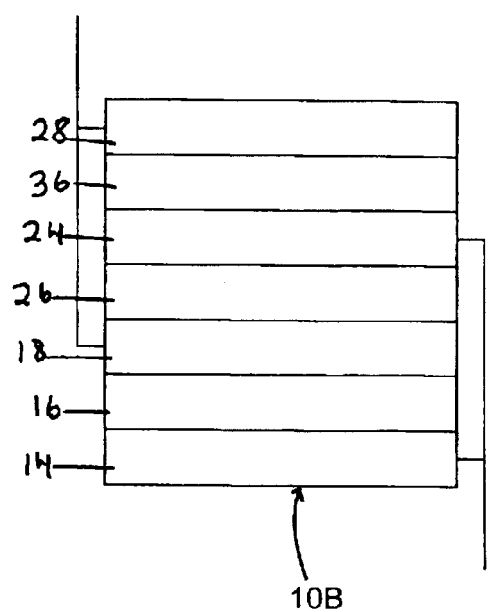

FIGS. 3a, b show schematically capacitors 10A, 10B with serial and parallel connections of a conductive film (Baytron)-oxide array with three layers of oxide 16, 26, and 36 and four of conductive film 14, 18, 24, and 28, each layer being about one micron.

A thin film capacitor of the invention is generally made by (i) applying a polymeric film comprising a conductive polymer located on a substrate, (ii) applying a pentoxide layer, tantalum pentoxide, or niobium pentoxide, or mixtures thereof to the polymeric conductive layer, and (iii) applying a second conductive polymer located on the pentoxide layer. The process steps can be repeated, depending on the number of component layers desired.

When polythiophene-based polymers in aqueous solutions are used, the solution is spread out on the substrate, by any suitable method, such as printing, bar coating, spin coating, or dip coating. After the solution has been applied a drying step is needed to evaporate the carrier solvent(s). In some cases it is advantageous to add some additional solvents and/or binders to the Baytron P solution, which in some cases increases the adherence of the film to the substrate.

When it is desirable to perform in-situ polymerization and make the polymeric conductive thin film onto the layer, the monomer and oxidant solution are mixed into one solution. The solution needs to be spread out on the substrate, which can be accomplished by any known wet method (such as printing, bar coating, spin coating, dip coating). After the solution has been applied a drying step is needed to evaporate the carrier solvent(s). The resulting polymer film is then washed to remove any salts that are formed during the polymerization.

The methods of establishing the ultra-thin but dense and highly dielectric oxide film include but are not limited to:

(a) physical vapor deposition (PVD) methods of, e.g., reactive sputtering or laser or EB scan heating of Ta, Nb targets to form oxide as deposited;

(b) sputtering an oxide target to transfer oxide to a film substrate (or to top a previously laid conductive layer);

(c) coating with a Ta, Nb film by any known method and anodizing it (by electrolytic or chemical anodization). In such case the film would be partly oxidized and the non-oxidized part becomes a part of the adjacent conductive layer.

Although the present invention has been described in detail with reference to certain preferred versions thereof, other variations are possible. Therefore, the spirit and scope of the appended claims should not be limited to the description of the versions contained therein.

What is claimed is:

1. A thin film capacitor comprising:
   (a) a substrate,
   (b) a first polymeric film comprising an electrically conductive polymer located on the substrate,
   (c) a pentoxide layer selected from the group consisting of tantalum pentoxide, or niobium pentoxide, and mixtures thereof, and located on a surface of the first polymeric film,
   (d) a second polymeric film comprising an electrically conductive polymer located on a surface of the pentoxide layer.

2. The thin film capacitor of claim 1, wherein the substrate is selected from the group consisting of vinyl polymers, olefin polymers, polyesters, and mixtures thereof.

3. The thin film capacitor of claim 1, wherein the first polymeric film and the second polymeric film is selected from the group consisting of polyanilin polymers, lignosulfonic acid polymers, poly pyrrol polymers, thiophene-based polymers, and mixtures thereof.

4. The thin film capacitor of claim 1, wherein the first polymeric film has a thickness ranging from about 100 nanometers to about 10 micrometers.

5. The thin film capacitor of claim 1, wherein the pentoxide layer has a thickness ranging from about 10 to about 100 nanometers.

6. The thin film capacitor wherein the substrate has a thickness that is at least about 0.01 mm.

7. The thin film capacitor of claim 1, wherein the first polymeric film or the second polymeric film is selected from the group consisting of polythiophene-based polymers, polyaniline-based polymers, polypyrrole-based polymers, polyethyleneoxide-based polymers, and mixtures or copolymers thereof.

8. A method for making a thin film capacitor comprising:
   (a) applying a first electrically conductive polymer located on a substrate,
   (b) applying a pentoxide layer, tantalum pentoxide, or niobium pentoxide, or mixtures thereof to the polymeric conductive layer, and
   (c) applying a second electrically conductive polymer located on the pentoxide layer, and thereby forming a thin film capacitor.

9. The method of claim 8, wherein the thin film capacitor formed comprises:
   (a) a substrate,
   (b) a first polymeric film comprising an electrically conductive polymer located on the substrate,
   (c) a pentoxide layer selected from the group consisting of tantalum pentoxide, or niobium pentoxide, and mixtures thereof, located on a surface of the first polymeric film,
   (d) a second polymeric film comprising an electrically conductive polymer located on a surface of the pentoxide layer.

10. The method of claim 8, wherein the thin film capacitor comprises (a) a substrate, (b) a first polymeric conductive layer located on a surface of the substrate and (c) a plurality of alternating pentoxide layer/polymeric electrically conductive layers extending from the first polymeric layer, wherein the total number of pentoxide layers is n and the total number of polymeric conductive layers is n+1.

11. The method of claim 8, wherein the wherein the first polymeric film and the second polymeric film is selected from the group consisting of polyaniline-based polymers, polypyrrole-based polymers, polyethyleneoxide-based polymers, polythiophene-based polymers, and mixtures or copolymers thereof.

* * * * *